United States Patent
Coffey et al.

(10) Patent No.: US 10,153,593 B2
(45) Date of Patent: Dec. 11, 2018

(54) CAPACITIVE COMPENSATION

(71) Applicant: CommScope Technologies LLC, Hickory, NC (US)

(72) Inventors: Joseph C. Coffey, Burnsville, NM (US); Christine Anne Dooley, Lewisville, NC (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 15/676,456

(22) Filed: Aug. 14, 2017

(65) Prior Publication Data
US 2018/0131137 A1    May 10, 2018

Related U.S. Application Data

(63) Continuation of application No. 14/799,046, filed on Jul. 14, 2015, now Pat. No. 9,735,509.
(60) Provisional application No. 62/024,754, filed on Jul. 15, 2014.

(51) Int. Cl.
| | | |
|---|---|---|
| *H01R 13/6466* | (2011.01) |
| *H05K 1/11* | (2006.01) |
| *H05K 1/18* | (2006.01) |
| *H05K 1/02* | (2006.01) |
| *H01R 24/64* | (2011.01) |

(52) U.S. Cl.
CPC ....... *H01R 13/6466* (2013.01); *H05K 1/0216* (2013.01); *H05K 1/111* (2013.01); *H05K 1/115* (2013.01); *H05K 1/181* (2013.01); *H01R 24/64* (2013.01); *H05K 1/0245* (2013.01); *H05K 2201/10053* (2013.01); *H05K 2201/10212* (2013.01)

(58) Field of Classification Search
CPC ....... H01K 1/02016; H01K 1/11; H01K 1/115
USPC .................................................. 439/620.22
See application file for complete search history.

(56) References Cited

U.S. PATENT DOCUMENTS

| | | | | |
|---|---|---|---|---|
| 5,559,427 | A  * | 9/1996 | Hinds | G01R 31/021 324/519 |
| 6,764,343 | B2 * | 7/2004 | Ferentz | H01R 13/6658 439/620.01 |
| 7,038,554 | B2 | 5/2006 | Seefried | |
| 7,140,924 | B2 * | 11/2006 | Redfield | H05K 1/0228 439/676 |
| 7,312,109 | B2 * | 12/2007 | Madurawe | H01L 21/8221 438/138 |
| 7,445,507 | B1 * | 11/2008 | Parker | H01R 13/665 439/620.18 |
| 7,736,195 | B1 * | 6/2010 | Poulsen | H01R 13/6658 439/676 |
| 7,785,115 | B2 * | 8/2010 | Busse | H01R 29/00 439/188 |

(Continued)

OTHER PUBLICATIONS

International Search Report and Written Opinion for Application No. PCT/US2015/032095 dated Sep. 8, 2015.

*Primary Examiner* — Alexander Gilman
(74) *Attorney, Agent, or Firm* — Merchant & Gould P.C.

(57) ABSTRACT

A capacitive coupling system includes a plurality of conductive pads situated on a dielectric layer. A plurality of switches are connected between pairs of the conductive pads via conductive linkages. The switches are operable to selectively connect selected pairs of the conductive pads to selectively adjust capacitances between conductor pairs of an electrical connector.

6 Claims, 5 Drawing Sheets

(56) References Cited

U.S. PATENT DOCUMENTS

| | | | |
|---|---|---|---|
| 7,828,603 B1* | 11/2010 | Ku | H01R 13/6466 439/676 |
| 7,837,513 B2* | 11/2010 | Millette | H01R 13/6466 439/676 |
| 7,850,492 B1* | 12/2010 | Straka | H01R 13/6625 439/676 |
| 7,896,672 B2* | 3/2011 | Felisilda De La Cruz | H01R 13/6625 200/51.1 |
| 8,128,432 B2* | 3/2012 | Jaouen | H01R 13/6464 439/620.01 |
| 8,272,876 B2* | 9/2012 | Schultz | H01R 13/719 439/305 |
| 8,287,317 B2* | 10/2012 | Straka | H05K 1/0228 439/676 |
| 8,485,843 B2* | 7/2013 | Chang | H01R 24/64 439/541.5 |
| 8,535,966 B2* | 9/2013 | Anderson | H01H 59/00 257/415 |
| 8,858,266 B2* | 10/2014 | Robinson | H01R 13/646 439/607.38 |
| 8,910,129 B1* | 12/2014 | Wilkerson | G06F 11/3664 717/131 |
| 8,998,620 B2* | 4/2015 | Ni | H01R 12/71 361/737 |
| 9,000,557 B2* | 4/2015 | Or-Bach | H01L 21/8221 257/506 |
| 9,069,910 B2* | 6/2015 | Zhang | G06F 13/4022 |
| 9,209,569 B2* | 12/2015 | Schumacher | H01R 13/6466 |
| 9,219,322 B1* | 12/2015 | Wei | H01R 12/7076 |
| 9,735,509 B2* | 8/2017 | Coffey | H01R 13/6466 |
| 2004/0014362 A1* | 1/2004 | Slack | H01R 13/6658 439/620.11 |
| 2004/0184247 A1 | 9/2004 | Adriaenssens et al. | |
| 2005/0106941 A1* | 5/2005 | Witchey | H04L 69/08 439/620.09 |
| 2005/0181676 A1* | 8/2005 | Caveney | H05K 1/0228 439/676 |
| 2005/0253662 A1* | 11/2005 | Seefried | H05K 1/0228 333/1 |
| 2009/0104821 A1 | 4/2009 | Marti et al. | |
| 2009/0163084 A1* | 6/2009 | Straka | H01R 13/6658 439/676 |
| 2010/0062644 A1 | 3/2010 | Aekins et al. | |

* cited by examiner

CAPACITIVE COMPENSATION

CROSS REFERENCE TO RELATED APPLICATIONS

This application is a continuation of application Ser. No. 14/799,046, filed Jul. 14, 2015, which application claims the benefit of provisional application Ser. No. 62/024,754, filed Jul. 15, 2014, which applications are incorporated herein by reference in their entirety.

BACKGROUND

The present disclosure relates generally to electrical connectors.

Electrical connectors that are commonly used in telecommunication systems provide an interface between successive runs of cables and/or between cables and electronic devices of the system. Some of such electrical connectors, for example modular jacks, are configured to be joined with a mating plug having an array of mating contacts. A printed circuit may be provided to establish an electrical connection between the mating contacts and the cable or electronic device.

The performance of some electrical connectors, such as modular jacks and plugs, may be negatively affected by crosstalk generated along the signal path between adjacent differential pairs of the mating contacts of the electrical connector. To improve the performance of the connectors, techniques are used to provide compensation for the crosstalk. For example, some known techniques arrange the contacts and/or conductive traces of the printed circuit with respect to each other provide the compensation.

Improvements in crosstalk compensation are desired.

SUMMARY

In accordance with aspects of the present disclosure a capacitive coupling system includes a plurality of conductive pads situated on a dielectric layer. A plurality of switches are connected between pairs of the conductive pads via conductive linkages. The switches are operable to selectively connect selected pairs of the conductive pads. The capacitive coupling system is used in conjunction with an electrical connector in some embodiments. The electrical connector includes a plurality of conductive traces situated on a substrate that are arranged as differential pairs. One side of the dielectric is positioned adjacent the conductive traces, and the conductive pads are situated on the opposite side of the dielectric layer. The switches selectively connect selected pairs of the conductive pads to adjust capacitive coupling between the differential pairs of the conductive traces.

BRIEF DESCRIPTION OF THE DRAWINGS

FIG. 5A illustrates ideal trace structure, FIG. 5B illustrates an over-etch condition and FIG. 5C illustrates and under-etch condition.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as top, bottom, front, back, etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense.

Some electrical connectors, such as modular jacks, may be negatively affected by crosstalk generated along the signal path between adjacent differential pairs of the mating contacts of the electrical connector. In accordance with certain aspects of the present disclosure, finite capacitive coupling across signal conductor paths is provided to mitigate the imbalance created by manufacturing tolerances and physical displacement of conducting paths. The disclosed capacitive coupling could be provided, for example, in connector assemblies using printed circuit boards (PCBs) to provide electrical connections within the connector, or in other types of interconnects such as lead frames.

Figure 1:
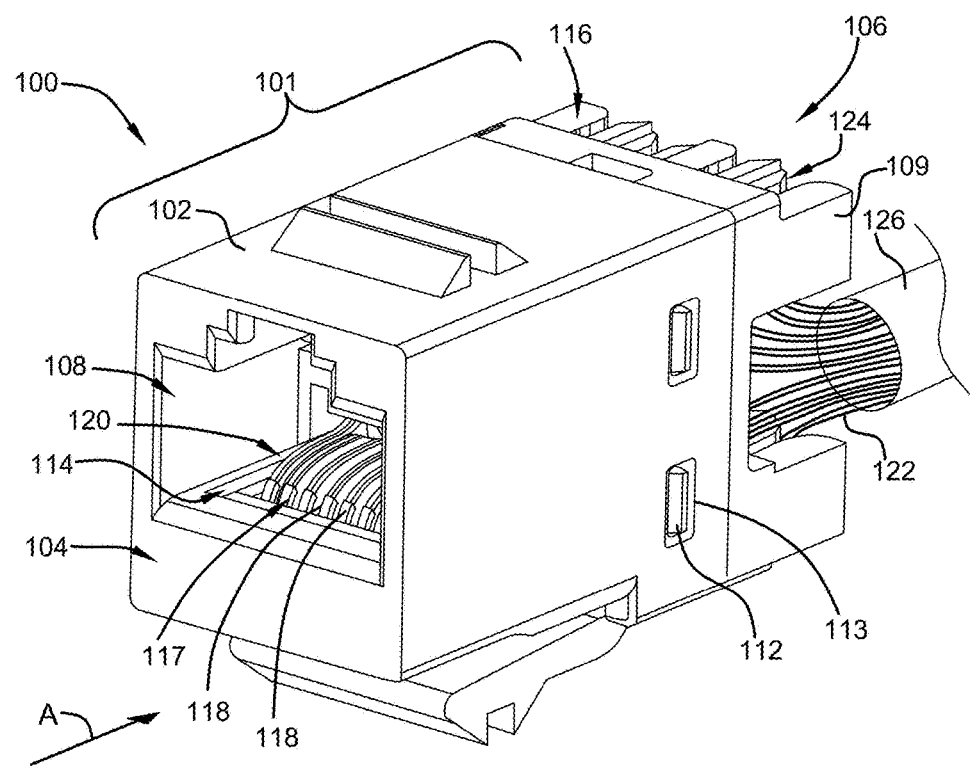
FIG. 1 is a perspective view illustrating aspects of an electrical connector system in accordance with aspects of the present disclosure.

FIG. 1 is perspective view illustrating an example of an electrical connector 100. The connector 100 shown in FIG. 1 is a modular connector, such as, but not limited to, an RJ-45 outlet or communication jack. However, the subject matter described and/or illustrated herein is applicable to other types of electrical connectors. The connector 100 is configured to receive and engage a mating plug, such as a modular plug (also referred to as a mating connector). The modular plug is loaded along a mating direction, shown generally by arrow A. The connector 100 includes a connector body 101 having a mating end 104 that is configured to receive and engage the modular plug and a loading end 106 that is configured to electrically and mechanically engage a cable 126. The connector body 101 may include a housing 102 extending from the mating end 104 and toward the loading end 106. The housing 102 may at least partially define an interior chamber 108 that extends therebetween and is configured to receive the modular plug proximate the mating end 104.

The connector 100 includes an array 117 of mating conductors or contacts 118. Each mating conductor 118 within the array 117 includes a mating interface 120 arranged within the chamber 108. Each mating interface 120 engages (i.e., interfaces with) a corresponding mating or plug contact of the modular plug when the modular plug is mated with the connector 100. The arrangement of the mating conductors 118 may be at least partially determined by industry standards, such as, but not limited to, International Electrotechnical Commission (IEC) 60603-7 or Electronics Industries Alliance/Telecommunications Industry Association (EIA/TIA)-568. In some examples, the connector 100 includes eight mating conductors 118 arranged as differential pairs. However, the connector 100 may include any number of mating conductors 118, whether or not the mating conductors 118 are arranged in differential pairs.

Figure 2:
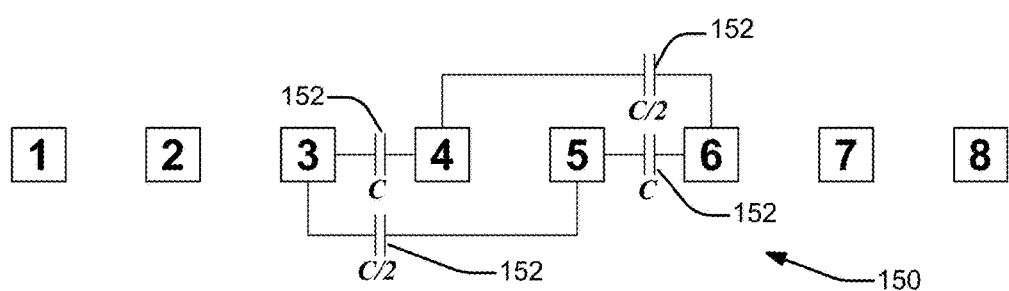
FIG. 2 is a block diagram conceptually illustrating capacitive coupling between conductor pairs of an electrical connector for crosstalk compensation.

Some PCBs used for connector applications such as the connector 100 have conductive traces that are laid out in such a way to cause signal coupling between different conductive traces. This coupling is designed to balance out the capacitive imbalance created by manufacturing tolerances and physical placement of the other conductive traces. FIG. 2 illustrates an example of such coupling between eight conductors 150 of the connector 100. For simplicity, only the 4,5 and 3,6 differential pair combinations of a PCB mounted RJ45 will be discussed. As conceptually illustrated in FIG. 2, the conductors 150 are situated such that capacitors 152 are formed therebetween.

The assumption is that the magnitude of the capacitive coupling between two adjacent pins is the unit value C. Since these are differential pairs, the coupling between the non-adjacent pins must also be considered. In this example, the distance between 3-5 and 4-6 is twice that of 3-4 and 5-6 therefore the magnitude of coupling capacitance is C/2.

Capacitance between any two conductors is inversely proportion to the distance between them as given by the following equation:

$$C = \epsilon_r \epsilon_0 \frac{A}{d}$$

Where $\epsilon_r$ is the permittivity of the dielectric material (e.g., air, polyimide, Teflon, etc.), $\epsilon_0$ is the permittivity of a vacuum (8.8541878176 ... ×10$^{-12}$ m$^{-3}$kg$^{-1}$s$^4$A$^2$ [F/m], universal constant), A is the surface area of the plates, and d is the distance between the plates. Any two metallic surfaces can form a coupling or parasitic capacitance provided they are galvanically isolated and have some form of dielectric media between them. For example, two metal plates suspended with air between them, two metals plates rolled or stacked together with a dielectric media between them, pins on a connector (or IC) with air or some dielectric media between them, or traces on a PCB separated by air or a dielectric media (e.g., solder mask material or conformal coating). In addition, points of concentricity (e.g., edge of a conductor) can contribute to the coupling by what is referred to as the "edge effect". The contribution the magnitude of the capacitance by this effect is random and unpredictable. It is also a major contributor to cross-talk and is very susceptible to process control in PCB manufacturing.

Figure 3:
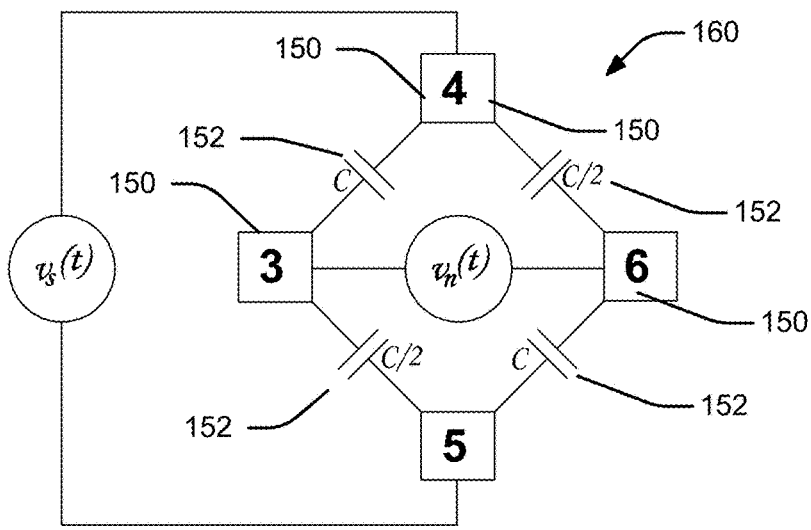
FIG. 3 is a schematic diagram illustrating a Wheatstone bridge circuit formed by the coupling capacitances shown in FIG. 2.

FIG. 3 schematically illustrates a Wheatstone bridge 160 formed by the coupling capacitances. The signal source $v_s(t)$ is the disturbing voltage (or signal) and $v_n(t)$ is the noise or crosstalk voltage produced by the imbalance of the bridge. If C is unit capacitance (unity), then C/2 is ½. This allows the magnitude of the noise voltage to be verified mathematically as follows:

$$v_n(t) = v_s(t)\left[\frac{C_{3,4}}{C_{3,4} + C_{3,5}} - \frac{C_{4,6}}{C_{4,6} + C_{5,6}}\right]$$

$$v_n(t) = v_s(t)\left[\frac{1}{\frac{1}{2}+1} - \frac{\frac{1}{2}}{\frac{1}{2}+1}\right] = v_s(t)\left[\frac{2}{3} - \frac{1}{3}\right] = \frac{v_s(t)}{3}$$

Figure 4:
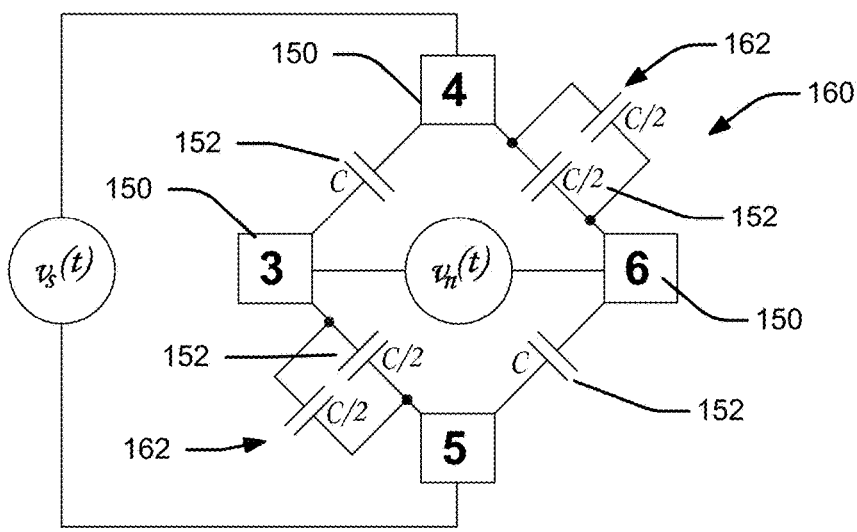
FIG. 4 is a schematic diagram illustrating the Wheatstone bridge circuit of FIG. 3, further including additional capacitances to balance the bridge.

The magnitude of the noise voltage is ⅓ of the magnitude of the input voltage. For the noise voltage to be zero, the bridge 160 must be balanced by the addition of capacitance 162 as shown in FIG. 4.

Connecting capacitors in parallel results in a value that is the sum of the two capacitances. Adding a capacitance 164 of C/2 to the 4,6, and 3,5 conductive pairs results in the following value.

$$\frac{C}{2} + \frac{C}{2} = \frac{2C}{2} = C$$

If C is unit capacitance (unity), the balanced to be verified mathematically as follows:

$$v_n(t) = v_s(t)\left[\frac{C_{3,4}}{C_{3,4} + C_{3,5}} - \frac{C_{4,6}}{C_{4,6} + C_{5,6}}\right]$$

$$v_n(t) = v_s(t)\left[\frac{1}{1+1} - \frac{1}{1+1}\right] = v_s(t)\left[\frac{1}{2} - \frac{1}{2}\right] = 0$$

The most common technique used to mitigate (e.g., tune) the noise or cross-talk voltage involves the positioning of PCB traces to increase the capacitive coupling between the non-adjacent pairs. This is quite effective assuming that the position of the connector contacts is always consistent and the PCBs used for interconnection are always manufactured using processes that produce consistent PCBs.

Figure 5A:
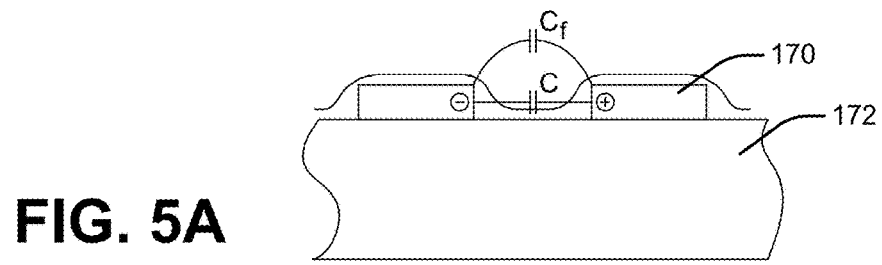
FIGS. 5A, 5B and 5C are end views illustrating examples of conductive traces of an electrical connector situated on a substrate, where
Figure 5B:
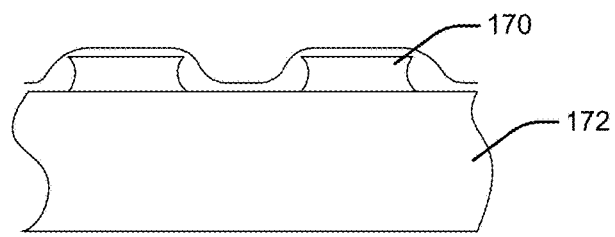
Figure 5C:
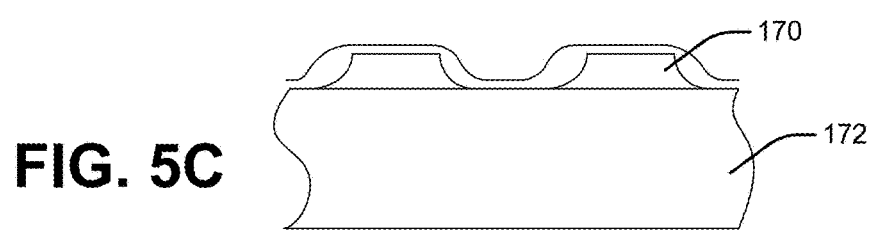

PCBs that have been tuned to remove imbalances for cross-talk performance requires must be manufacturing consistently. FIGS. 5A, 5B and 5C conceptually illustrate aspects of different conductive traces 170 situated on a PCB substrate 172. The PCB cross section shown in FIG. 5A what an ideal trace structure would look like. The cross section shown in FIG. 5B is an over-etch condition and the cross section in FIG. 5C is an under-etch condition. In FIG. 5A, C is the unit capacitance between two adjacent traces 170 and $C_f$ is the fringe capacitance.

PCBs used in an RJ45 application, for example, may require a considerable amount of tuning to mitigate the cross-talk effect caused by an imbalanced arrangement of connector contacts. In addition, the capacitive coupling is usually in the pico and femto farad range ($10^{-12}$-$10^{-15}$), which makes the tuning susceptible to variations in PCB fabrication.

Another method is to locate a mid-point and reverse one conductive pair. This reverses the phase of part of the noise voltage cancelling most of the noise overall. In open wire telegraph applications this was referred to as the transposition theorem. However, the midpoint is never exact due to fabrication tolerance issues.

Figure 6:
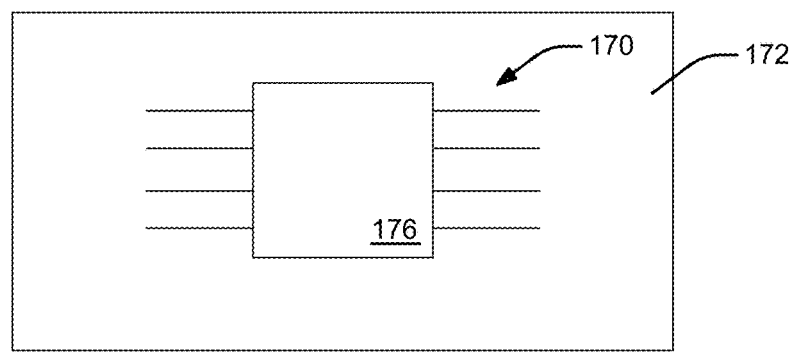
FIG. 6 is a block diagram illustrating an example of a crosstalk compensation system in accordance with aspects of the present disclosure.

FIG. 6 is a block diagram schematically illustrating aspects of crosstalk compensation system in accordance with the present disclosure. As described above, conductive traces 170 are situated on a PCB substrate 172. A capacitive coupling system 176 is positioned proximate the conductive traces 170 to selectively adjust capacitance to compensate for the imbalance in the signal traces 172 caused, for example, by fabrication instability.

Since the magnitude of coupling capacitance is very small, some examples of the capacitive coupling system 176 disclosed herein use an application specific integrated circuit (ASIC) to adjust or compensate for the imbalance in signal traces. The ASIC is positioned across the signal paths but is galvanically isolated by a dielectric interface. The dielectric can be a layer of $HfO_2$ or $SiO_2$ or an equivalent. Inside the ASIC is an array or metal (or semiconductor) pads that are positioned above each signal path to form a finite capacitor.

Figure 7:
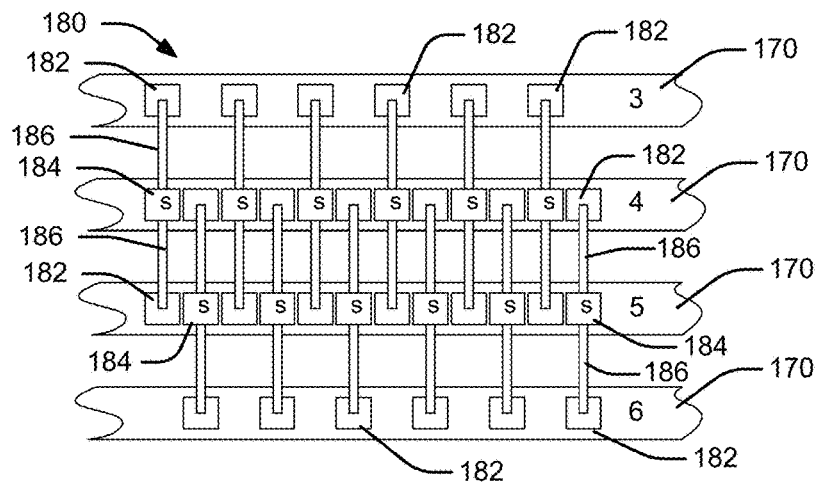
FIG. 7 is a schematic top view illustrating portions of an application specific integrated circuit (ASIC) of the crosstalk compensation system shown in FIG. 6.
Figure 8A:
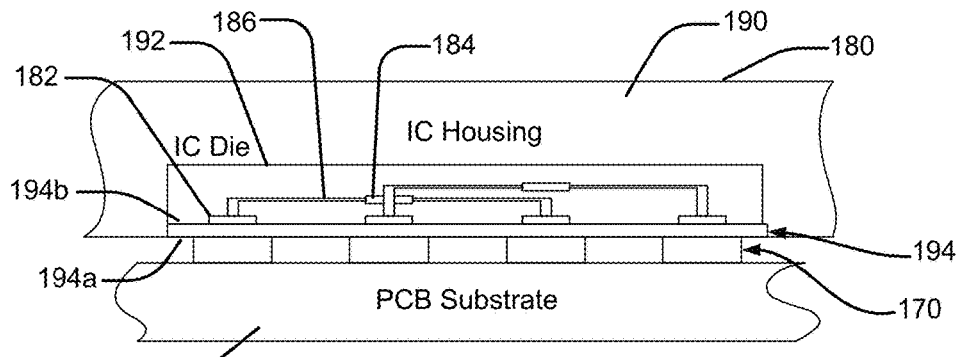
FIGS. 8A and 8B are end views of the ASIC shown in FIG. 7.
Figure 8B:
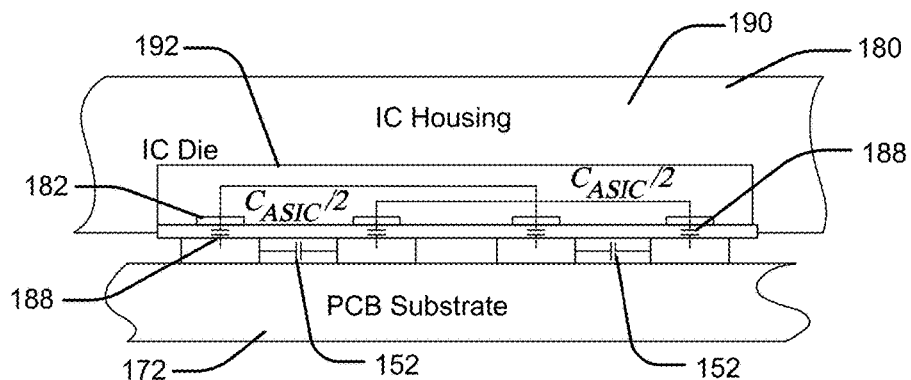

FIG. 7 is a schematic top view, and FIGS. 8A and 8B are end views conceptually illustrating aspects of an ASIC 180 in accordance with the present disclosure. FIG. 7 shows pads 182 positioned above the signal paths 170 for the 4,5 and 3,6 conductors of the connector 100. The pads 182 are connected to switches 184 via a conductive linkage or path 186. FIGS. 8A and 8B illustrate further aspects of the ASIC 180, which includes a housing 190 surrounding a semiconductor die 192. The pads 182 are situated on a dielectric layer 194 such as $SiO_2$, $HfO_2$, etc., and a first side 194a of the dielectric layer 194 is positioned over the conductive paths 170. The pads 182 are positioned on a second side 194b of the dielectric layer 194 opposite the first side 194a. FIG. 8A conceptually shows the physical implementation of the ASIC 180 positioned over the signal paths 170, and FIG. 8B illustrates the electrical equivalent. FIG. 7 further illustrates an example of the distribution of the coupling capacitance along the length of the signal paths 170. When the switch 184 is activated, an electrical path is created between the corresponding pads 182 and a finite coupling capacitance is added between the signal paths 170 as shown in FIG. 8B.

In this manner, capacitance can be added incrementally along the length of the signal paths 170 while keeping the ASIC 180 electrically isolated. Using a lumped parameter can cause a resonance effect to occur at specific frequencies. As shown in FIG. 8B, each linkage 186 between the pads 182 connects two capacitors 152, 188 in series with a total capacitance equal to $C_{ASIC}/2$. However, since the capacitors 188 are distributed along the length of the signal path 170, the effect is additive but not lumped. The total capacitance added between two signal paths 170 is $nC_{ASIC}/2$ where n is the number if linkages 186 that have been activated or turned on using the associated switches 184. Once the desired capacitance has been added, the switches 184 can be fused or latched in a permanent ON state. In some examples, battery technology is used inside to the ASIC 180 so the switches 184 are not permanently fused allowing the compensation to be repeatedly changed. In other envisioned embodiments, MEMS technology is employed to create low resistance switches 184 that can be toggled to allow repetitive compensation.

Figure 9:
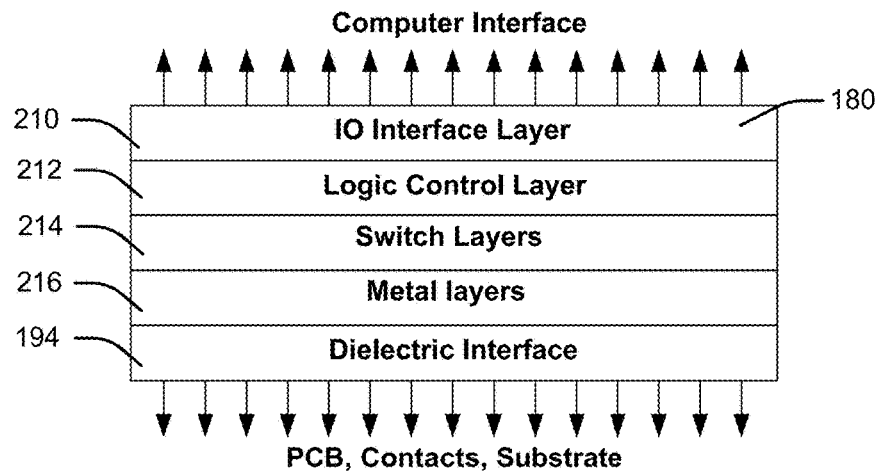
FIG. 9 is a block diagram illustrating examples of layers included in the ASIC shown in FIGS. 7 and 8.

An example of the architecture of the ASCI 180 is shown in FIG. 9. The illustrated ASIC 180 includes the dielectric interface layer 194 that is situated proximate the conductive traces 170, substrate 172, etc. One or more metal layers 216 include the pads 182 and interconnecting links 186, and is positioned over the dielectric layer 194. One or more switch layers 214 that include the switches 184 are situated over the metal layer 216. A logic control layer 212 provides matrix decoding for switch selection, and may contain a microcontroller core or simple I2C address decoding system. An input/output (IO) interface layer 210 is situated over the logic control layer 212 for communicating with external devices such as a computer or other processing device.

Figure 10:
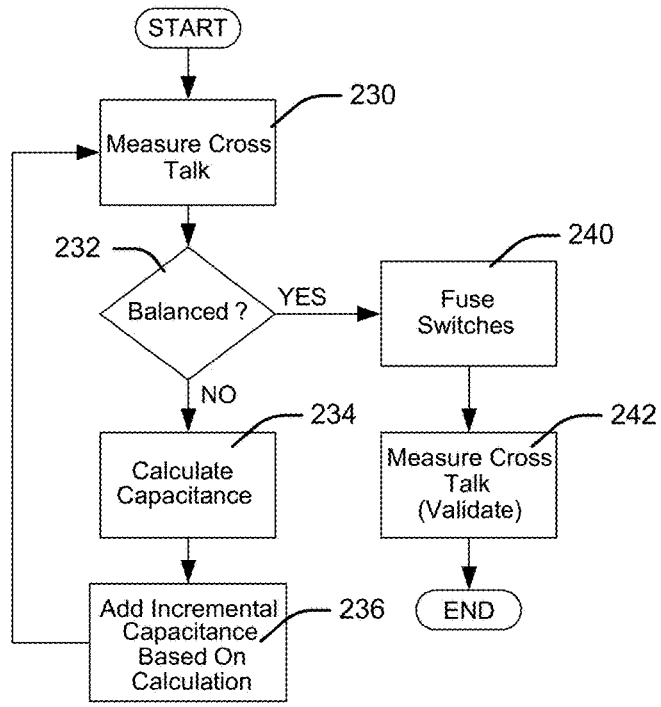
FIG. 10 is a flow diagram illustrating an example of a capacitive compensation system in accordance with aspects of the present disclosure.

FIG. 10 is a flow diagram illustrating an example of a compensation process using the disclosed compensation system 176. In block 230, crosstalk is measured between preselected conductor pairs (e.g., 4,5-3,6). If the coupling capacitances are not balanced as determined in decision block 232, the required additional capacitance is determined in block 235, and the required capacitance is added in block 236 by operating the switches 184. The process then returns to block 230 and repeats until decision block 232 determines the circuit is balanced. In some implementations, the process then continues by fusing the switches 184 in block 240, and the crosstalk is again measured in block 242 to validate the compensation process.

Various modifications and alterations of this disclosure may become apparent to those skilled in the art without departing from the scope and spirit of this disclosure, and it should be understood that the scope of this disclosure is not to be unduly limited to the illustrative examples set forth herein.

What is claimed is:

1. A electrical connector system comprising:
a connector body having a mating end that is configured to receive and engage a modular plug, and a loading end that is configured to electrically and mechanically engage a cable;
a housing extending from the mating end toward the loading end, the housing defining an interior chamber configured to receive the modular plug;
an array of mating conductors situated in the housing, each of the mating conductors having a mating interface configured to engages a corresponding contact of the modular plug when the modular plug is receive by the connector body;
a substrate situated in the housing including a plurality of conductive traces electrically connected to the mating conductors, the conductive traces being arranged as differential pairs; and
a crosstalk compensation system including:
a dielectric layer having first and second sides, the first side being positioned adjacent the conductive traces;
a plurality of conductive pads situated on the second side of the dielectric layer such that the dielectric layer is positioned between the conductive traces and the conductive pads, the plurality of conductive pads forming a corresponding plurality of capacitors with the conductive traces;
a plurality of switches, each switch connected between a pair of the conductive pads via conductive linkages, the switches being operable to selectively connect selected pairs of the conductive pads to adjust capacitive coupling between the differential pairs of the conductive traces.

2. The electrical connector system of claim 1, further comprising an ASIC, the ASIC including:
the dielectric layer;
a metal layer including the plurality of switches situated over the dielectric layer;
a switch layer including the plurality of switches situated over the metal layer;
a logic controller layer situated over the switch layer; and
an input/output layer situated over the logic controller layer.

3. The electrical connector system of claim 1, wherein the switches are operable in response to a capacitance measurement between preselected conductor pairs.

4. The electrical connector system of claim 2, wherein the logic controller layer is configured to selectively operate the switches to add a predetermined incremental capacitance between the conductive traces.

5. The electrical connector system of claim 4, wherein the total capacitance added is determined according to $$nC/2$$

where C is the capacitance of each capacitor formed by a pair of the conductive pads and the corresponding conductive traces, and n is the total number of switches that have been operated to connect the corresponding first and second conductive pads.

6. The electrical connector system of claim 1, wherein the plurality of switches are fusible switches configured to be selectively latched in a permanent ON state.

\* \* \* \* \*